United States Patent [19]

Hrovath

[11] Patent Number: 4,744,713
[45] Date of Patent: May 17, 1988

[54] MISALIGNMENT SENSOR FOR A WAFER FEEDER ASSEMBLY

[75] Inventor: Julius G. Hrovath, Houston, Tex.

[73] Assignee: Texas Instruments Incorporated, Dallas, Tex.

[21] Appl. No.: 865,484

[22] Filed: May 21, 1986

[51] Int. Cl.[4] ............................................. A61K 27/02
[52] U.S. Cl. .................................... 414/222; 356/152; 414/786
[58] Field of Search ............... 414/222, 226, 730, 786; 901/9, 45; 356/152

[56] References Cited

U.S. PATENT DOCUMENTS

| | | | |
|---|---|---|---|
| 4,402,053 | 8/1983 | Kelley et al. | 414/730 X |
| 4,444,492 | 4/1984 | Lee | 356/152 X |
| 4,486,842 | 12/1984 | Hermann | 414/730 X |
| 4,493,606 | 1/1985 | Foulke et al. | 414/730 X |
| 4,553,069 | 11/1985 | Purser | 414/222 X |
| 4,603,897 | 8/1983 | Foulke et al. | 414/730 X |
| 4,611,966 | 9/1986 | Johnson | 414/226 X |
| 4,615,615 | 10/1986 | Krolak et al. | 901/45 X |

FOREIGN PATENT DOCUMENTS 2135120  8/1984  United Kingdom ................ 414/222

Primary Examiner—Kenneth J. Dorner
Assistant Examiner—Thomas A. Rendos
Attorney, Agent, or Firm—Thomas R. FitzGerald; N. Rhys Merrett; Melvin Sharp

[57] ABSTRACT

In an ion implantation device having a wafer holder assembly with a plurality of wafer holders each with a retractable wafer clamp and a wafer feeder for loading a wafer onto each wafer holder, there is provided a misalignment sensor which includes a light source for directing a collimated beam of light onto each wafer holder once a wafer has been loaded onto a corresponding wafer holder but before being clamped. A light sensor is coupled to the light souce for detecting light reflected at a predetermined angle from a loaded wafer. A display is provided for indicating misalignment of a wafer in response to the absence of reflected light being detected by the sensor at a predetermined time following loading.

6 Claims, 1 Drawing Sheet

MISALIGNMENT SENSOR FOR A WAFER FEEDER ASSEMBLY

BACKGROUND OF THE INVENTION

The present invention relates to a sensor for sensing any misalignment in position of a wafer on a wafer holder of an ion implantation machine following the wafer being fed onto the holder and before the wafer is clamped to the holder.

Present ion implantation machines have disc like structures with a plurality of wafer holder radially arranged about the center of the disc for holding a number of wafers, one of each holder. The holders each have a wafer pad upon which a wafer is loaded and a wafer clamp which is spring loaded and clamps down on the edges of the wafer to hold it firmly in place while being implanted. Two pins and two screws spaced around a periphery of the disc in conjuction with the clamp are used to hold a disc in position. Once the disc assembly is fully loaded it is moved by a transfer arm into a substantially vertical position in which it is rotated at speeds of rotation of up to 900 RPM while being implantated. Because of the heat generated on each wafer by the impinging ions which may have been accelerated through a voltage of up to 160 keV energy it is necessary to limit the time in the path of the accelerated ions as well as provide the wafers with a heat sink.

Often is happens that a disc will get misloaded and rest on one of the pins used to keep them in position. Once the loading clamps press down on the wafer the relatively fragile wafer breaks. If the broken wafer goes undetected once it is positioned facing the ion beam and spun at a high speed of rotation, the broken pieces fly around and break the other wafers mounted on the wafer assembly. In addition silicon dust particles become embedded in the ion implantation chamber and bombard subsequent loads of wafers during implantation leaving them with a pitted surface. Thus, the yields of implanted devices is considerably reduced.

Accordingly, it is a principal object of the present invention to provide an improved method of mounting wafer onto wafer holders. It is a further object to provide an apparatus for sensing any misalignment in the mounting of a wafer.

SUMMARY OF THE INVENTION

According to the invention in an ion implantation device having a wafer holder assembly with a plurality of wafer holders each with a retractable wafer clamp and a wafer feeder for loading a wafer onto each wafer holder, there is provided a misalignment sensor which includes a light source for directing a collimated beam of light onto each wafer holder once a wafer has been loaded onto a corresponding wafer holder but before being clamped. A light sensor is coupled to the light source for detecting light reflected at a predetermined angle from a loaded wafer. Means are provided for indicating misalignment of a wafer in response to the absence of reflected light being detected by the sensor at a predetermined time following loading.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
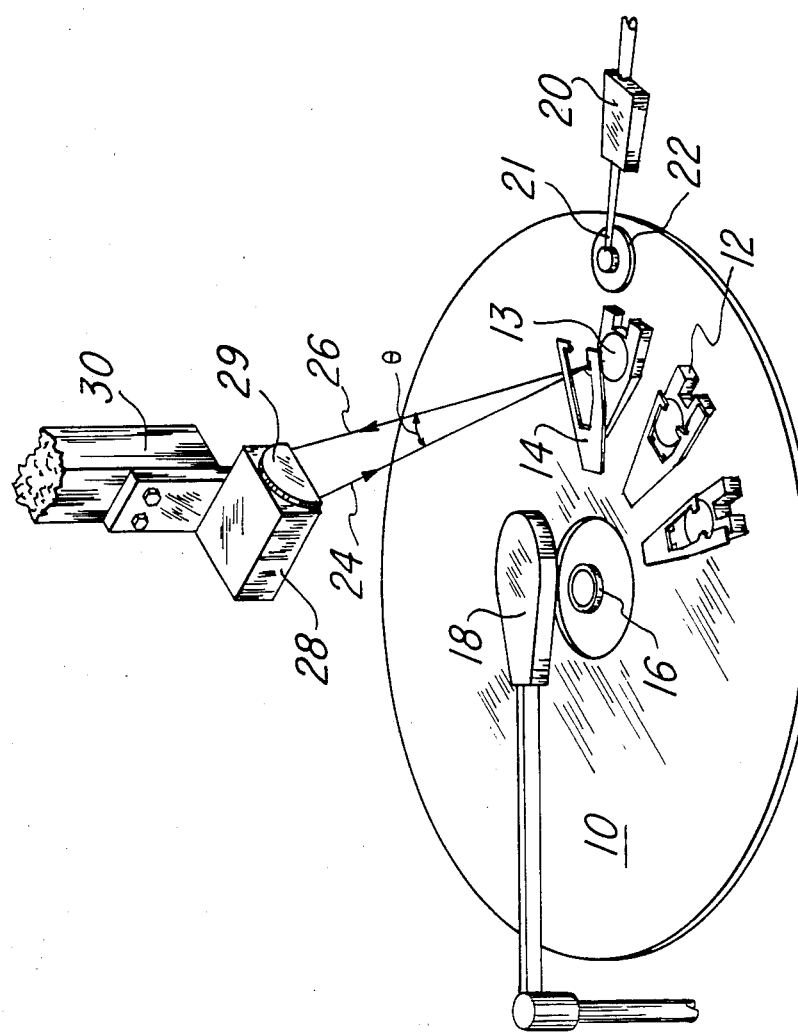
FIG. 1 is a perspective view of a wafer holder assembly, light source and sensor and wafer feeder in accordance with a preferred embodiment of the invention.

Referring to FIG. 1, there is shown a portion of an ion implantation device which includes an wafer holder disc assembly 10 onto which are attached a plurality of radially spaced apart wafer holders (shown in detail in FIG. 2) 12, a wafer feeder 20 and a light source-detector 28. A disc transfer arm 18 is positioned with its head over the center 16 of the disc 10. The light source-detector 28 is rotatably attached to an end plate 29 and affixed to an overhead arm 30.

Figure 2:
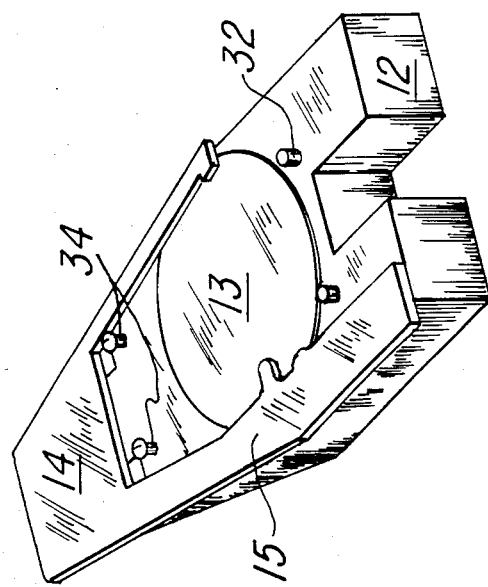
FIG. 2 is a perspective view of a wafer holder.

Referring to FIG. 2, each disc holder 12 has a circular disc pad 13 and four positioning pins 32 and 34 spaced around the pad 13. The pad 13 is inclined downwardly towards the center of the disc at a slight angle. A spring loaded clamp 14 has two arms 15 and 17 which engage the wafer 22 when loaded. The wafer loader 20 has an arm 21 which picks up a wafer by vacuum and releases it over a pad 13 positioned in a feed position. At this time clamp 14 is automatically raised. In the event a wafer is misloaded and rests partially over one or both of pins 32, once clamp 14 is released, it breaks the relatively fragile thin silicon wafer. To avoid this problem a detector is used to detect when a wafer is misloaded. The detector or misalignment sensor 28 utilizes the fact that if misaligned a wafer will rest on one of the positioning pins 32 or 34 and in general be in a plane which is not parallel to the plane defined by pad 13.

Figure 3:
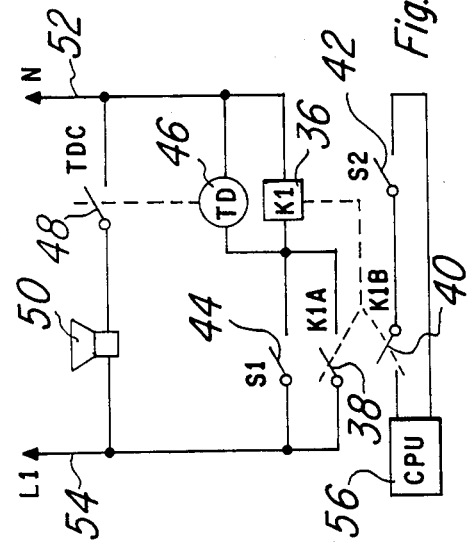
FIG. 3 is a circuit diagram of the misalignment detection system of the wafer holder assembly.

According to the invention a source of infrared laser light is mounted over top the wafer holder disc 10 and is positioned so that it impinges onto a preselected wafer holder surface and so that a light sensor also mounted with the light source detects the reflected light from a wafer mounted onto the holder 12 in the feed position. Referring to FIG. 3, a microswitch 44 coupled to feed arm 21 closes when the latter moves forward thereby energizing sensor module 36. Energizing sensor 36 causes switch 38 to close as shown in FIG. 3. When the feed arm 21 moves back after loading a wafer 22, even though switch 44 opens again, switch 38 maintains current flowing through sensor 36 until light reflected from wafer 22 is sensed. When the wafer or slice is sensed, sensor 36 is de-energized causing switch 38 to open and switch 40 to close. Switch 42 is a switch normally found on such units and is closed when the feed arm 21 is retracted. Thus, a central processing unit 56 which is coupled to switches 40 and 42 sends a signal indicating the feed arm 21 is in a retracted position once switch 40 closes.

In the event that the wafer 22 is not sensed by the sensor 36, switch 40 stays open blocking the signal from CPU 56 indicating the feed arm 21 is in a retracted position. After a preselected time has elapsed the CPU gives an error message which indicates that the wafer has not been loaded correctly and blocking the clamp from being released. An operator must then correct the position of the misloaded wafer before continuing a load operation.

Optionally, a time delay relay 46 can be coupled across the sensor 36 with a corresponding contact switch 48 in series with an audible/visual alarm 50. If the sensor 36 does not de-energize (or does not see the wafer) within a preset time.

While this invention has been described with reference to an illustrative embodiment, this description is not intended to be construed in a limiting sense. Various modifications of the illustrativel embodiment, as well as other embodiments of the invention, will be apparent to persons skilled in the art upon reference to this description. It is, threfore, contemplated that the appended claims will cover any such modifications or embodiments as fall within the true scope of the invention.

What is claimed is:

1. In an ion implantation device having a wafer holder assembly with a plurality of wafer holders each having a retractable wafer clamp and wafer feeder for loading wafers onto respective wafer holders, and a misalignment sensor, comprising:
   a light source for directing a collimated beam of light onto each wafer once a wafer has been loaded onto a corresponding wafer holder but before being clamped;
   a light sensor positioned relative to said light source for detecting light reflected from a loaded wafer at a predetermined angle from the direction of the incident beam of light; and
   means for indicating a misaligned wafer in response to the absence of reflected light being detected by said sensor within a predetermined time following loading.

2. A sensor according to claim 1, wherein said indicating means includes a feed switch mounted on said wafer feeder to indicate when a feed arm thereof is extended corresponding to said feeder feeding a wafer onto said wafer holder, an actuator activated by the closing of said feed switch to close a first switch in parallel with said feed switch and by the detection of reflected light to open said first switch and close a second switch coupled to a processor which issues a signal indicating that a wafer has been correctly loaded.

3. A sensor according to claim 2, including a time delay relay in parallel with said actuator activated by the closing of said feed switch responsive to close a circuit containing an audio/visual alarm on the de-energizing of said actuator.

4. A sensor according to claim 2, wherein said light source is an infrared laser.

5. A sensor according to claim 2, wherein said feed arm switch and said first switch are microswitches.

6. A method of detecting misloading of a wafer on a wafer holder of an ion implanter, comprising:
   directing a collimated beam of light onto a wafer loaded onto said wafer holder at said wafer holder's wafer loading position immediately following loading of a wafer thereon;
   detecting reflected light from a wafer loaded onto said wafer holder at a predetermined angle with respect to the direction of incidence of said collimated beam equal to twice the angle of incidence onto a properly loaded wafer mounted thereon; and
   means for indicating when reflected light is not detected following loading of a wafer onto a wafer holder.

* * * * *

UNITED STATES PATENT AND TRADEMARK OFFICE
CERTIFICATE OF CORRECTION

PATENT NO. : 4,744,713

DATED : May 17, 1988

INVENTOR(S) : Julius G. Horvath

It is certified that error appears in the above-identified patent and that said Letters Patent is hereby corrected as shown below:

On the Title Page, Item [75] Inventor:

Please change "Julius G. Hrovath" to --Julius G. Horvath--.

Signed and Sealed this

Fourth Day of October, 1988

Attest:

DONALD J. QUIGG

*Attesting Officer*  *Commissioner of Patents and Trademarks*